(12) United States Patent
Mantor

(10) Patent No.: US 12,660,682 B2
(45) Date of Patent: Jun. 16, 2026

(54) DIE STACKING FOR MODULAR PARALLEL PROCESSORS

(71) Applicant: ADVANCED MICRO DEVICES, INC., Santa Clara, CA (US)

(72) Inventor: Michael Mantor, Orlando, FL (US)

(73) Assignee: Advanced Micro Devices, Inc., Santa Clara, CA (US)

(*) Notice: Subject to any disclaimer, the term of this patent is extended or adjusted under 35 U.S.C. 154(b) by 834 days.

(21) Appl. No.: 17/217,165

(22) Filed: Mar. 30, 2021

(65) Prior Publication Data

US 2022/0320042 A1     Oct. 6, 2022

(51) Int. Cl.
*H10W 90/00* (2026.01)
*G06F 13/40* (2006.01)
*G06T 1/20* (2006.01)

(52) U.S. Cl.
CPC ........ *H10W 90/00* (2026.01); *G06F 13/4027* (2013.01); *G06T 1/20* (2013.01)

(58) Field of Classification Search
CPC ... G06T 1/20; G06F 13/4027; H01L 25/0652; H01L 25/18; H01L 2225/06513
USPC ........................................................ 345/418
See application file for complete search history.

(56) References Cited

U.S. PATENT DOCUMENTS

| | | | | |
|---|---|---|---|---|
| 9,135,373 B1* | 9/2015 | Jarosz | .................... | G06F 30/398 |
| 10,403,577 B1* | 9/2019 | Huang | ................ | H01L 25/0652 |
| 10,803,548 B2* | 10/2020 | Matam | .................. | G06F 13/409 |
| 11,609,879 B2* | 3/2023 | Fu | ........................ | G06F 12/0284 |
| 11,791,938 B2* | 10/2023 | Podlozhnyuk | ........ | H04L 1/0076 |
| | | | | 370/328 |
| 2009/0067851 A1 | 3/2009 | Krishnamoorthy et al. | | |
| 2013/0279232 A1 | 10/2013 | Sharette et al. | | |
| 2014/0380003 A1 | 12/2014 | Hsu et al. | | |
| 2015/0171015 A1* | 6/2015 | Mahajan | ............. | H01L 23/3114 |
| | | | | 257/774 |
| 2018/0294230 A1* | 10/2018 | Dabral | .................... | H01L 25/18 |

(Continued)

FOREIGN PATENT DOCUMENTS

| | | |
|---|---|---|
| WO | 2013119309 | 8/2013 |
| WO | 2020190369 A1 | 9/2020 |
| WO | 2020190810 A1 | 9/2020 |

OTHER PUBLICATIONS

Jiang J, Parto K, Cao W, Banerjee K. Monolithic-3D integration with 2D materials: Toward ultimate vertically-scaled 3D-ICs. In2018 IEEE SOI-3D-Subthreshold Microelectronics Technology Unified Conference (S3S) Oct. 15, 2018 (pp. 1-3). IEEE.*

(Continued)

*Primary Examiner* — Phu K Nguyen

(57) ABSTRACT

A multi-die parallel processor semiconductor package includes a first base IC die including a first plurality of virtual compute dies 3D stacked on top of the first base IC die. A first subset of a parallel processing pipeline logic is positioned at the first plurality of virtual compute dies. Additionally, a second subset of the parallel processing pipeline logic is positioned at the first base IC die. The multi-die parallel processor semiconductor package also includes a second base IC die including a second plurality of virtual compute dies 3D stacked on top of the second base IC die. An active bridge chip communicably couples a first interconnect structure of the first base IC die to a first interconnect structure of the second base IC die.

20 Claims, 4 Drawing Sheets

(56)     References Cited

U.S. PATENT DOCUMENTS

| | | | |
|---|---|---|---|
| 2018/0309965 | A1* | 10/2018 | Ahmed .................. H04N 23/16 |
| 2019/0044520 | A1* | 2/2019 | Tang .......................... G06F 1/12 |
| 2019/0158096 | A1* | 5/2019 | Tang ....................... H01L 24/16 |
| 2019/0312019 | A1 | 10/2019 | Pietambaram et al. |
| 2019/0341350 | A1* | 11/2019 | Huang ................ H01L 23/5387 |
| 2019/0385977 | A1* | 12/2019 | Elsherbini ............... H01L 24/17 |
| 2020/0091128 | A1* | 3/2020 | Elsherbini .......... H01L 23/5386 |
| 2020/0098164 | A1* | 3/2020 | Bruns ..................... G06T 15/10 |
| 2020/0098621 | A1* | 3/2020 | Bharath .................. H01L 25/18 |
| 2020/0098725 | A1* | 3/2020 | Liff .......................... H01L 24/16 |
| 2020/0111734 | A1 | 4/2020 | Lin et al. |
| 2020/0294181 | A1* | 9/2020 | Matam ...................... G06T 1/20 |
| 2020/0312766 | A1 | 10/2020 | Bhagavat et al. |
| 2020/0395309 | A1* | 12/2020 | Cheah ................ H01L 25/0655 |
| 2021/0097013 | A1* | 4/2021 | Saleh .................. G06F 12/0893 |
| 2021/0098419 | A1* | 4/2021 | Saleh ....................... H01L 24/96 |
| 2021/0133583 | A1* | 5/2021 | Chetlur ................... G10L 15/16 |
| 2021/0158599 | A1* | 5/2021 | Saleh ......................... G06T 1/20 |
| 2021/0305132 | A1* | 9/2021 | Karhade ................. H01L 24/83 |
| 2021/0305133 | A1* | 9/2021 | Karhade ............ H01L 23/4825 |
| 2022/0199562 | A1* | 6/2022 | Waidhas ................. H01L 24/17 |
| 2023/0197705 | A1* | 6/2023 | Rubin ................ H01L 25/0655 |
| | | | 257/668 |
| 2023/0281136 | A1* | 9/2023 | Felix ................... G06F 13/4068 |
| | | | 710/110 |
| 2023/0305853 | A1* | 9/2023 | Ciolkosz ............... G06F 9/3851 |
| | | | 712/220 |
| 2023/0308270 | A1* | 9/2023 | Miele .................... H04L 9/0866 |
| | | | 455/410 |
| 2023/0325656 | A1* | 10/2023 | Li ............................ G06N 3/08 |
| | | | 706/25 |
| 2024/0097796 | A1* | 3/2024 | Winzer ................ H04B 10/503 |
| 2024/0201444 | A1* | 6/2024 | Chao ........................ G02B 6/43 |

OTHER PUBLICATIONS

K. Banerjee, et al., "3-D ICs: a novel chip design for improving deepsubmicrometer interconnect performance and systems-on-chip integration," Proc. IEEE, vol. 89, pp. 602-633, 2001.*

Lee D, Das S, Kim DH, Doppa JR, Pande PP. Design space exploration of 3D network-on-chip: A sensitivity-based optimization approach. ACM Journal on Emerging Technologies in Computing Systems (JETC). Oct. 23, 2018;14(3):1-26.*

Yan G, Tian J, Zhu S, Dai Y, Qin C. Fast cone-beam CT image reconstruction using GPU hardware. Journal of X-ray Science and Technology. Jan. 1, 2008;16(4):225-34.*

Kim HE, Yoon JS, Hwang KD, Kim YJ, Park JS, Kim LS. A reconfigurable heterogeneous multimedia processor for IC-stacking on Si-interposer. IEEE transactions on circuits and systems for video technology. Oct. 18, 2011;22(4):589-604.*

J. Zhang et al., "An Embedded Multi-Die Active Bridge (EMAB) Chip for Rapid-Prototype Programmable 2.5D/3D Packaging Technology," 2022 IEEE Symposium on VLSI Technology and Circuits (VLSI Technology and Circuits), Honolulu, HI, USA, 2022, pp. 262-263, doi: 10.1109/VLSITechnologyandCir46769.2022.9830188. keywords:.*

Duan G, Kanaoka Y, McRee R, Nie B, Manepalli R. Die embedding challenges for EMIB advanced packaging technology. In2021 IEEE 71st Electronic Components and Technology Conference (ECTC) Jun. 1, 2021 (pp. 1-7). IEEE.*

Cavalcante M, Kurth A, Schuiki F, Benini L. Design of an open-source bridge between non-coherent burst-based and coherent cache-line-based memory systems. InProceedings of the 17th ACM International Conference on Computing Frontiers May 11, 2020 (pp. 81-88).*

Zhang Y, Sarvey TE, Bakir MS. Thermal evaluation of 2.5-D integration using bridge-chip technology: Challenges and opportunities. IEEE Transactions on Components, Packaging and Manufacturing Technology. Jun. 28, 2017;7(7): 1101-10.*

Zhang Y, Zhang X, Bakir MS. Benchmarking digital die-to-die channels in 2.5-D and 3-D heterogeneous integration platforms. IEEE Transactions on Electron Devices. Nov. 6, 2018;65(12):5460-7.*

Liu SL, Kao N, Shih T, Wang YP. Fan-out embedded bridge solution in HPC application. In2021 IEEE 23rd Electronics Packaging Technology Conference (EPTC) Dec. 7, 2021 (pp. 222-225). IEEE.*

Li L, Chia P, Ton P, Nagar M, Patil S, Xue J, Delacruz J, Voicu M, Hellings J, Isaacson B, Coor M. 3D SiP with organic interposer for ASIC and memory integration. In2016 IEEE 66th Electronic Components and Technology Conference (ECTC) May 3, 20161 (pp. 1445-1450). IEEE.*

Lu, Wei, et al. "Scalable Embedded Multi-Die Active Bridge (S-EMAB) Chips with Integrated LDOs for Low-Cost Programmable 2.5 D/3.5 D Packaging Technology." 2024 IEEE Symposium on VLSI Technology and Circuits (VLSI Technology and Circuits). IEEE, 2024.*

Kuttappa, Ragh, Baris Taskin, Scott Lerner, and Vasil PaNo. "Resonant clock synchronization with active silicon interposer for multi-die systems." IEEE Transactions on Circuits and Systems I: Regular Papers 68, No. 4 (2021): 1636-1645.*

Pano V, Kuttappa R, Taskin B. 3D NoCs with active interposer for multi-die systems. InProceedings of the 13th IEEE/ACM International Symposium on Networks-on-Chip Oct. 17, 2019 (pp. 1-8).*

Vivet P, Guthmuller E, Thonnart Y, Pillonnet G, Fuguet C, Miro-Panades I, Moritz G, Durupt J, Bernard C, Varreau D, Pontes J. IntAct: A 96-core processor with six chiplets 3D-stacked on an active interposer with distributed interconnects and integrated power management. IEEE Journal of Solid-State Circuits. 2020 D.*

International Search Report and Written Opinion issued in Application No. PCT/US2022/022279, mailed Jul. 21, 2022, 11 pages.

Extended European Search Report mailed Jan. 21, 2025 for European Application No. 22781996.8, 12 pages.

International Preliminary Report on Patentability issued in Application No. PCT/US2022/022279 mailed Oct. 13, 2023, 7 pages.

Examination Report mailed Aug. 19, 2025 for European App. No. 22781996.8, 8 pages.

Korean Office Action mailed Oct. 27, 2025 for Korean Application No. 10-2023-7035148, 17 pages.

* cited by examiner

100

PROCESSOR
102A

PROCESSOR
102B

■
■
■

PROCESSOR
102N

HOST
PROCESSOR
114

104

I/O INTERFACES
106

MEMORY
CONTROLLER(S)
108

DISPLAY
CONTROLLER
110

OTHER
DEVICE(S)
112

200

300

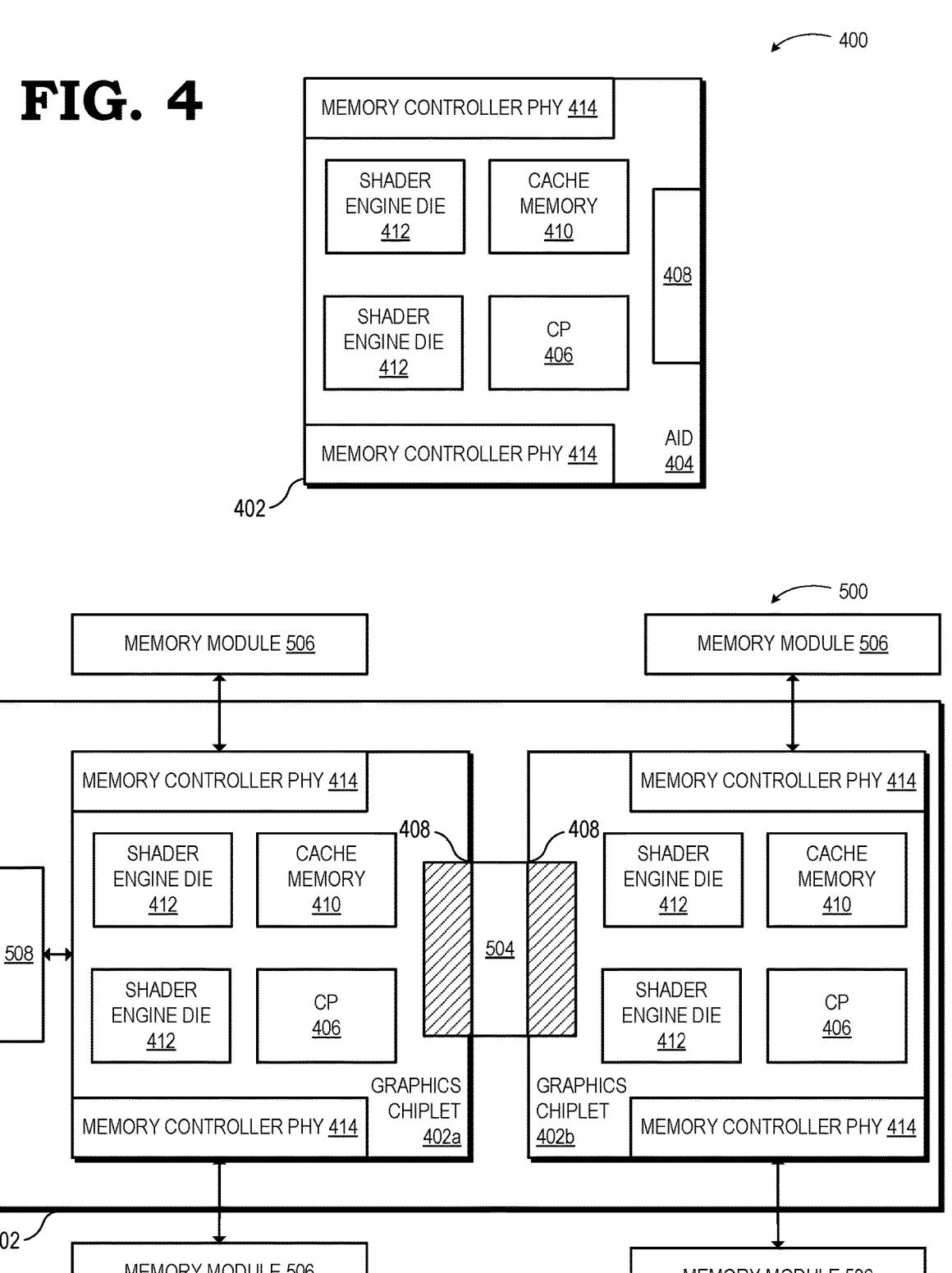

MEMORY CONTROLLER PHY 414

SHADER ENGINE DIE 412

CACHE MEMORY 410

408

SHADER ENGINE DIE 412

CP 406

MEMORY CONTROLLER PHY 414

AID 404

MEMORY MODULE 506

MEMORY MODULE 506

MEMORY CONTROLLER PHY 414

SHADER ENGINE DIE 412

CACHE MEMORY 410

408

408

SHADER ENGINE DIE 412

CACHE MEMORY 410

508

504

SHADER ENGINE DIE 412

CP 406

SHADER ENGINE DIE 412

CP 406

GRAPHICS CHIPLET 402a

GRAPHICS CHIPLET 402b

MEMORY CONTROLLER PHY 414

MEMORY CONTROLLER PHY 414

502

MEMORY MODULE 506

MEMORY MODULE 506

DIE STACKING FOR MODULAR PARALLEL PROCESSORS

BACKGROUND

Multi-chip integration, in which two or more integrated circuits (ICs or "chips") are configured to interoperate with one another, includes various techniques such as using multi-chip modules, systems in a package, and three-dimensional chip stacking. Some conventional multi-chip modules include two or more semiconductor chips mounted side-by-side on a carrier substrate or in some cases on an interposer (so-called "2.5D") that is, in-turn, mounted on a carrier substrate. Similarly, stacked semiconductor chip architectures include integrated circuit designs with one or more interconnecting structures between chips, between chips and package, and between package and a printed circuit board.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 4 is a block diagram of an example of a graphics processing stacked die chiplet in accordance with some embodiments.

FIG. 5 is a block diagram illustrating an example graphics processor multi-chip module employing graphics processing stacked die chiplets in accordance with some embodiments.

DETAILED DESCRIPTION

Figure 1:
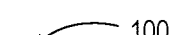
FIG. 1 is a block diagram of a computing system implementing multi-die parallel processors in accordance with some embodiments.

Processing units, such as graphics processing units (GPUs) or other parallel processing units, are conventionally fabricated as a monolithic device deployed on a die that is becoming increasingly expensive to manufacture. As advances in processing technology allow ever increasing number of components to be fabricated on an integrated circuit (IC), the industry is constantly striving to integrate more circuit devices for each packaged integrated circuit. However, the manufacturing of a semiconductor chip involves many process steps, and with every step there can be imperfections, variability, and alignment issues resulting in one or more defects (or other variances relative to design specification) in the manufactured ICs. Such manufacturing defects can produce chips with defects resulting in inoperable chips that require discarding of the end product.

One technique that allows more circuit devices and more performance from a packaged IC is through the use of multi-chip module (MCM) technology. MCMs integrate a plurality of individual modules of circuit devices formed on a single IC die. The various MCM components are often integrated onto a unifying substrate so that the MCM operates as a single component. Multi-chip modules come in a variety of forms depending on complexity, which can range from using pre-packaged ICs on a printed circuit board (PCB) arranged to mimic the package footprint of an existing chip package. MCMs have the advantage of increasing yields of highly complex ICs by piecing a complex IC together with smaller IC components. In this way, defects that do occur effect individual components of the MCM rather than a single large complex die. Defects affecting the larger dies are much more costly.

To address these problems and to enable improved system performance, FIGS. 1-7 describe systems and devices utilizing multiple 3D die stacked building blocks that are communicably stitched together to form a device having similar performance relative to a larger monolithic processor. In various embodiments, a multi-die parallel processor semiconductor package includes a first base IC die including a first plurality of virtual compute dies 3D stacked on top of the first base IC die. A first subset of a parallel processing pipeline logic is positioned at the first plurality of virtual compute dies. Additionally, a second subset of the parallel processing pipeline logic is positioned at the first base IC die. The multi-die parallel processor also includes a second base IC die including a second plurality of virtual compute dies 3D stacked on top of the second base IC die. An active bridge chip communicably couples a first interconnect structure of the first base IC die to a first interconnect structure of the second base IC die. In this manner, a larger number of smaller footprint base dies may be manufactured out of a silicon wafer. A subset of the smaller die that include defects are discarded before forming processing units (e.g., the virtual compute dies) over the remaining good dies (i.e., non-defective dies), thereby reducing costs associated with scrapping stacked devices due to defective large complex dies.

FIG. 1 illustrates a block diagram of one embodiment of a computing system 100 implementing a multi-die parallel processor in accordance with some embodiments. In various embodiments, computing system 100 includes at least one or more processors 102A-N, fabric 104, input/output (I/O) interfaces 106, memory controller(s) 108, display controller 110, and other device(s) 112. In various embodiments, to support execution of instructions for graphics and other types of workloads, the computing system 100 also includes a host processor 114, such as a central processing unit (CPU). In various embodiments, computing system 100 includes a computer, laptop, mobile device, server, or any of various other types of computing systems or devices. It is noted that the number of components of computing system 100 vary in some embodiments. It is also noted that in some embodiments computing system 100 includes other components not shown in FIG. 1. Additionally, in other embodiments, computing system 100 is be structured in other ways than shown in FIG. 1.

Fabric 104 is representative of any communication interconnect that complies with any of various types of protocols utilized for communicating among the components of the computing system 100. Fabric 104 provides the data paths, switches, routers, and other logic that connect the processing units 102, I/O interfaces 106, memory controller(s) 108, display controller 110, and other device(s) 112 to each other. Fabric 104 handles the request, response, and data traffic, as well as probe traffic to facilitate coherency. Fabric 104 also handles interrupt request routing and configuration access paths to the various components of computing system 100. Additionally, fabric 104 handles configuration requests, responses, and configuration data traffic. In some embodiments, fabric 104 is bus-based, including shared bus configurations, crossbar configurations, and hierarchical buses with bridges. In other embodiments, fabric 104 is packet-based, and hierarchical with bridges, crossbar, point-to-point, or other interconnects. From the point of view of fabric 104, the other components of computing system 100 are referred to as "clients". Fabric 104 is configured to process requests generated by various clients and pass the requests on to other clients.

Memory controller(s) 108 are representative of any number and type of memory controllers coupled to any number and type of memory device(s). For example, the type of memory device(s) coupled to memory controller(s) 108 include Dynamic Random Access Memory (DRAM), Static Random Access Memory (SRAM), NAND Flash memory, NOR flash memory, Ferroelectric Random Access Memory (FeRAM), or others. Memory controller(s) 108 are accessible by processors 102, I/O interfaces 106, display controller 110, and other device(s) 112 via fabric 104. I/O interfaces 106 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices are coupled to I/O interfaces 106. Such peripheral devices include (but are not limited to) displays, keyboards, mice, printers, scanners, joysticks or other types of game controllers, media recording devices, external storage devices, network interface cards, and so forth. Other device(s) 112 are representative of any number and type of devices (e.g., multimedia device, video codec).

In various embodiments, each of the processors 102 is a parallel processor (e.g., vector processors, graphics processing units (GPUs), general-purpose GPUs (GPGPUs), non-scalar processors, highly-parallel processors, artificial intelligence (AI) processors, inference engines, machine learning processors, other multithreaded processing units, and the like). Each parallel processor 102 is constructed as a multi-chip module (e.g., a semiconductor die package) including two or more base integrated circuit dies (described in more detail below with respect to FIG. 2) communicably coupled together with bridge chip(s) such that a parallel processor is usable (e.g., addressable) like a single semiconductor integrated circuit. As used in this disclosure, the terms "die" and "chip" are interchangeably used. Those skilled in the art will recognize that a conventional (e.g., not multi-chip) semiconductor integrated circuit is manufactured as a wafer or as a die (e.g., single-chip IC) formed in a wafer and later separated from the wafer (e.g., when the wafer is diced); multiple ICs are often manufactured in a wafer simultaneously. The ICs and possibly discrete circuits and possibly other components (such as non-semiconductor packaging substrates including printed circuit boards, interposers, and possibly others) are assembled in a multi-die parallel processor.

Accordingly, as described in more detail with respect to FIGS. 2-7 below, in various embodiments, each of the individual parallel processors 102 include two or more parallel processing stacked die chiplets communicably coupled together with an active bridge chip to form a device having similar performance relative to a larger monolithic processor. It should be recognized that although various embodiments are described below in the particular context of a GPU for ease of illustration and description, in various embodiments, the organization of GPU processing pipeline components into multiple discrete dies is applicable to any parallel processor without departing from the scope of this disclosure. For example, in various embodiments, the concepts described here is also similarly applicable to other processors including accelerated processing units (APUs), discrete GPUs (dGPUs), artificial intelligence (AI) accelerators, other parallel processors, central processing units (CPUs), and the like.

Figure 2:
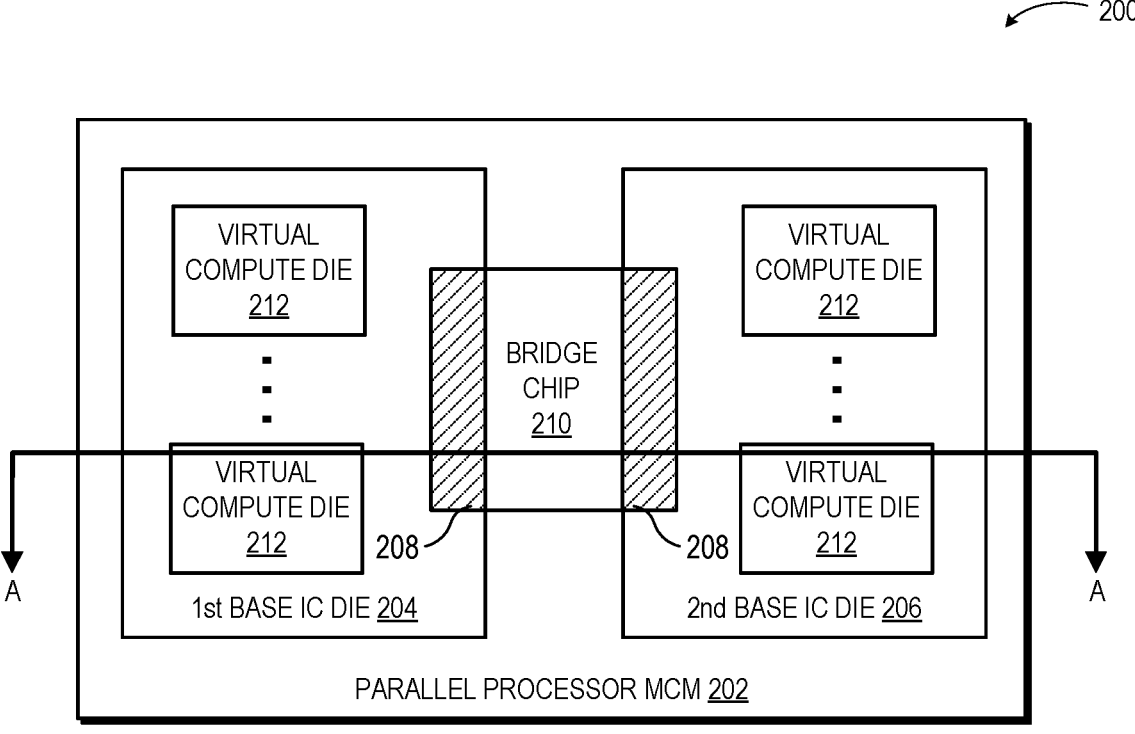
FIG. 2 is a block diagram illustrating a plan view of a multi-die parallel processor in accordance with some embodiments.
Figure 3:
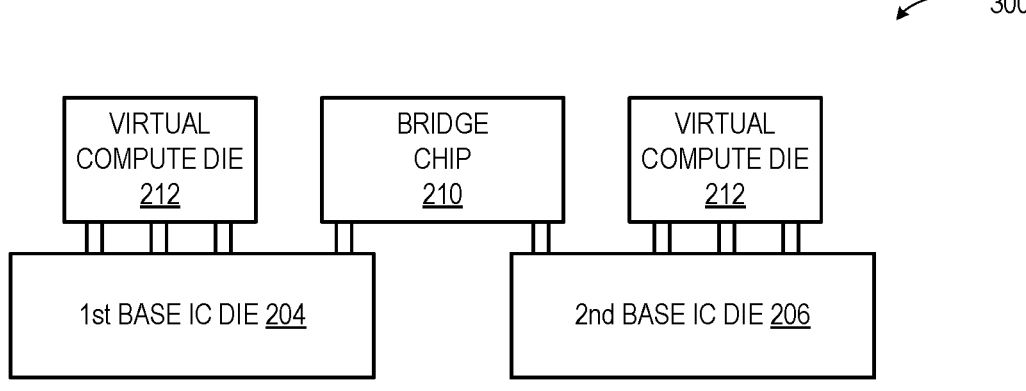
FIG. 3 is a block diagram illustrating a sectional view of a multi-die parallel processor in accordance with some embodiments.

Referring now to FIG. 2, illustrated is a block diagram illustrating a plan view 200 of a parallel processor MCM 202 in accordance with some embodiments. The parallel processor MCM 202 (e.g., processor 102 of FIG. 1) is formed as a single semiconductor chip package including N number of base dies. As shown in plan view 200, the parallel processor MCM 202 includes a first base IC die 204 and a second base IC die 206. The first base IC die 204 includes an inter-die interconnect structure 208 along at least a first edge of the first base IC die 204 (commonly referred to as the "beachfront"). Similarly, the second base IC die 206 also includes an inter-die interconnect structure 208 along at least a first edge of the second base IC die 206.

In various embodiments, the parallel processor MCM 202 includes a bridge chip 210 that communicably couples the first base IC die 204 to the second base IC die 206 via their respective inter-die interconnect structures 208. In various embodiments, the bridge chip 210 is passive or active, in which the bridge chip 210 includes just data/electrical connections or a given bridge chip 210 includes its own logic. For example, in some embodiments, the bridge chip 210 is an active bridge chip having active silicon to operate as a high-bandwidth die-to-die interconnect between the first base IC die 204 to the second base IC die 206. In other embodiments, the bridge chip 210 is a passive chip.

In some embodiments, the active bridge chip 210 includes one or more cache buffers and therefore extends beachfront edge connectivity, while still providing inter-base-die communications and to route cross die synchronization signals, without need for a memory physical interface (PHY). Caches are naturally an active component (i.e., require electrical power for operations), so the bridge chip 210 is active for holding those cache buffers. Cache sizing is configurable, for example, as a function of the physical size of the active bridge chip 210, for different applications along with different base die configurations, and the base die(s) to which the active bridge chip 210 is communicably coupled do not pay the cost (e.g., costs related to physical space, power constraints, and the like) of this external cache on the bridge chip 210.

In various embodiments, the bridge chip 210 includes a local silicon interconnect (LSI) that provides a small silicon bond in free translation that communicably couples two logic chips together and provides inter-die connectivity between adjacent edges of the two dies with a limited physical scope (e.g., as opposed to mounting the base IC dies 204,206 to a common interposer substrate and relying entirely on electrical connections provided by the interposer for inter-die communications, such as provided by conventional 2.5D topologies in which the interposer often spans the extent of an entire assembly). In this manner, the intermediary bridge chip 210 communicably couples multiple base IC dies (e.g., first base IC die 204 and second base IC die 206) together.

As shown in FIG. 2, the parallel processor MCM 202 includes two virtual parallel processing unit (vPPU) dies 212 (hereinafter referred to as "virtual compute dies" for ease of terminology) stacked on top of the first base IC die 204.

Similarly, the parallel processor MCM 202 also includes two virtual compute dies 212 stacked on top of the second base IC die 206. The vPPUs/virtual compute dies 212 are 'virtual' in the sense that a physical parallel processing unit is split into a plurality of vPPUs. In various embodiments, each vPPU die 12 includes a share (often an equal share) of the resources (e.g., frame buffer) and parallel processing capabilities of the physical parallel processing unit. In various embodiments, a compute pipeline is split between the base die (e.g., the first base IC die 204 and the second base IC die 206) and the stacked compute dies (e.g., the virtual compute die 212).

For example, such as described below in more detail with respect to FIG. 4 in the context of GPUs, in various embodiments, each vPPU die 212 is a shader engine die (SED) including at least a portion of the parallel processing pipeline microarchitecture. In various embodiments, the SED includes the shader system (or full shader engine), pixel pipes, geometry pipes, and the like. However, at least a portion of the graphics processing pipeline, such as the command processor, is retained in the base IC dies. Rather than just stacking compute cores on top of a common interposer, the base die is also split into two or more separate chips (e.g., the first base IC die 204 and the second base IC die 206). Additional details of the parallel processor MCM architecture may be understood with reference to FIG. 3, which is a block diagram illustrating a sectional view of a multi-die parallel processor in accordance with some embodiments. The view 300 provides a sectional view of the first base IC die 204 and its stacked virtual compute die 212, the second base IC die 204 and its stacked virtual compute die 212, and the bridge chip 210 of FIG. 2 taken at section A-A.

In various embodiments, such as shown in FIG. 2, the base IC die 204 is identical to base IC die 206. In other embodiments, the base IC die 204 has a structure different than that of base IC die 206. Additionally, in various embodiments, the base IC dies are symmetric such that translation (or rotation) of the base IC dies does not change the interconnect structure at the edge of the base IC dies (e.g., the beachfront) which increases flexibility in providing the base IC dies (and the corresponding stacked compute dies) as modular building blocks for combining with each other, memory dies, other system on a chip (SoC) dies, and the like. It should be appreciated that the base IC dies, in various embodiments, include one or more additional interconnect structures such as a second inter-chip interconnect structure 208, a physical layer (PHY) interface, and the like for communicably coupling to other dies. In this manner, high throughput interconnects (e.g., silicon bridges such as bridge chip 210) link multiple base dies (e.g., base IC dies 204,206) with each other as modular components and use a cooperative command processor for coordinating operations between the multiple dies to form a device having performance comparable to a larger monolithic GPU.

FIG. 4 is a block diagram of an example graphics processing stacked die chiplet in accordance with some embodiments. As shown in plan view 400, a graphics processing stacked die chiplet 402 includes a base active interposer die 404. It should be recognized that although the graphics processing stacked die chiplet 402 is described below in the particular context of GPU terminology for ease of illustration and description, in various embodiments, the architecture described is applicable to any of a variety of types of parallel processors (such as previously described more broadly with reference to FIGS. 2 and 3) without departing from the scope of this disclosure. Additionally, in various embodiments, and as used herein, the term "chiplet" refers to any device including, but is not limited to, the following characteristics: 1) a chiplet includes an active silicon die containing at least a portion of the computational logic used to solve a full problem (i.e., the computational workload is distributed across multiples of these active silicon dies); 2) chiplets are packaged together as a monolithic unit on the same substrate; and 3) the programming model preserves the concept that the combination of these separate computational dies (i.e., the graphics processing stacked die chiplet 402) as a single monolithic unit (i.e., each chiplet is not exposed as a separate device to an application that uses the chiplets for processing computational workloads).

The base active interposer die (AID) 404 (similar to the first base IC die 204 of FIG. 2) of the graphics processing stacked die chiplet 402 includes an inter-die interconnect structure 408 along at least a first edge of the base active interposer die 404 (commonly referred to as a "beachfront"). Additionally, the graphics processing stacked die chiplet 402 includes a plurality of shader engine dies (SEDs) 412 (similar to the virtual compute dies 212 of FIG. 2, but in various embodiments includes any appropriate parallel processing unit) formed over the active interposer die 404. Although illustrated as including two SEDs 412, those skilled in the art will recognize that any number of processing units may be positioned in the processing unit layer stacked above the active interposer die 404. In this configuration, a portion of a conventional graphics complex die (GCD) is pushed up to a second floor based on 3D die stacking methodologies by positioning the plurality of shader engine dies 412 in a layer on top of the active interposer die 404.

In various embodiments, each shader engine die 412 includes a share (often an equal share) of the resources and graphics processing capabilities of a GPU, but does not contain the entire graphics pipeline. In particular, a shader engine die 412 includes at least a portion of the graphics processing pipeline microarchitecture. For example, in some embodiments, the shader engine die 412 includes the shader system (not shown), pixel pipes (not shown), geometry logic (not shown), and the like. However, at least a portion of the graphics processing pipeline, such as a command processor 406, is positioned in the underlying base active interposer die 404. Additionally, in various embodiments, the base active interposer die 404 includes one or more levels of cache memory 410 and one or more memory controller PHYs 414 for communicating with external system memory (not shown), such as dynamic random access memory (DRAM) module. The memory controller (not shown) and memory controller PHYs 414 are, in other embodiments, provided on a separate die from the base active interposer die 404.

That is, various cache and inter-connectability components are positioned at the base active interposer die 404 (while high power active processing components are positioned in the stacked SEDs 412). Additionally, at least a portion of graphics pipeline logic, such as logic that controls multiple SEDs 412 together (e.g., the command processor 406) is also positioned at the base active interposer die 404. In this manner, the active interposer die 404 includes caches and a logic that controls multiple SEDs 412 together to control data for geometry state and command processing. This functional grouping of the active interposer die 404 and the plurality of SEDs 412 together form the graphics processing stacked die chiplet 402 (or may be referred to as a "GPU chiplet" for short).

Referring now to FIG. 5, illustrated is a block diagram of a plan view 500 of a graphics processor MCM 502 employing graphics processing stacked die chiplets in accordance with some embodiments. The graphics processor MCM 502 (similar to the parallel processor MCM 202 of FIG. 2) is formed as a single semiconductor chip package including N=2 number of communicably coupled graphics processing stacked die chiplets 402 of FIG. 4. As shown in plan view 500, the graphics processor MCM 502 includes a first graphics processing stacked die chiplet 402a and a second graphics processing stacked die chiplet 402b.

In various embodiments, the graphics processor MCM 502 includes a bridge chip 504 that communicably couples the first graphics processing stacked die chiplet 402a to the second graphics processing stacked die chiplet 402b via their respective inter-die interconnect structures 408. In various embodiments, the bridge chip 504 is passive or active, in which the bridge chip 504 includes just data/ electrical connections or a given bridge chip 504 includes its own logic. For example, in some embodiments, the bridge chip 504 is an active bridge chip having active silicon to operate as a high-bandwidth die-to-die interconnect between the first graphics processing stacked die chiplet 402a and the second graphics processing stacked die chiplet 402b. In other embodiments, the bridge chip 504 is a passive chip.

In some embodiments, the active bridge chip 504 includes one or more cache buffers and therefore extends beachfront edge connectivity, while still providing inter-base-die communications and to route cross die synchronization signals. Caches are naturally an active component (i.e., require electrical power for operations), so the bridge chip 504 is active for holding those cache buffers. Cache sizing is configurable, for example, as a function of the physical size of the active bridge chip 504, for different applications along with different stacked die chiplet configurations, and the stacked die chiplet(s) to which the active bridge chip 504 is communicably coupled do not pay the cost (e.g., costs related to physical space, power constraints, and the like) of this external cache on the bridge chip 504.

In various embodiments, the bridge chip 504 includes a local silicon interconnect (LSI) that provides a small silicon bond in free translation that communicably couples two logic chips together and provides inter-die connectivity between adjacent edges of the two dies with a limited physical scope (e.g., as opposed to mounting the stacked die chiplets 402 to a common interposer substrate and relying entirely on electrical connections provided by the interposer for inter-die communications, such as provided by conventional 2.5D topologies in which the interposer often spans the extent of an entire assembly). In this manner, the intermediary bridge chip 504 communicably couples multiple stacked die chiplets (e.g., the first graphics processing stacked die chiplet 402a and the second graphics processing stacked die chiplet 402b) together. Additionally, in various embodiments, the bridge chip 504 carries a data fabric (not shown) between the two stacked die chiplets to provide a common view of memory.

The coupling of multiple graphics processing stacked die chiplets (e.g., first graphics processing stacked die chiplet 402a to the second graphics processing stacked die chiplet 402b) together in a single package results in a device that effectively operates as a single large graphics complex die (GCD) but is constructed out of smaller, modular die components. In various embodiments, the graphics processor MCM 502 is communicably coupled to one or more external system memory modules 506 via the memory controller PHYs 414 of the graphics processing stacked die chiplets.

Additionally, in some embodiments, the graphics processor MCM 502 also includes input/output (I/O) logic in a multimedia and I/O die (MID) 508 separate from the graphics processing stacked die chiplets 402.

Figures 6, 7:
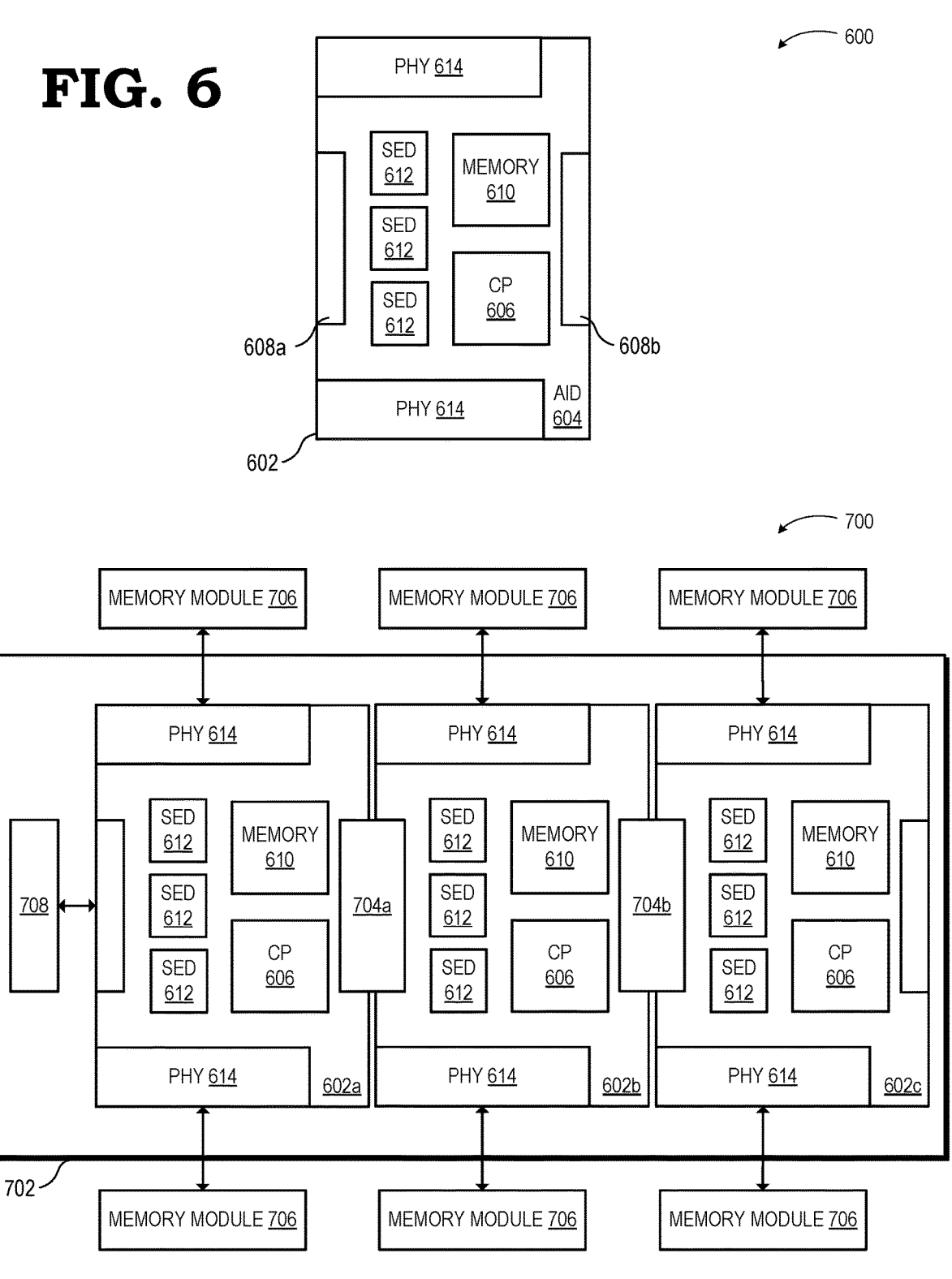
FIG. 6 is a block diagram illustrating another example of a graphics processing stacked die chiplet in accordance with some embodiments.
FIG. 7 is a block diagram illustrating another example of a graphics processor multi-chip module employing graphics processing stacked die chiplets in accordance with some embodiments.

Those skilled in the art will recognize that the modularity and scalability of subsequent MCMs resulting from coupling of graphics processing stacked die chiplets is a function of, amongst other factors, at least based on a number of interconnect structures along the edges of the graphics processing stacked die chiplets and a number of shader engine dies (or other virtual compute die) 3D stacked on top of each graphics processing stacked die chiplet. Referring now to FIG. 6, illustrated is another example of a graphics processing stacked die chiplet in accordance with some embodiments. As shown in plan view 600, a graphics processing stacked die chiplet 602 includes a base active interposer die 604. It should be recognized that although the graphics processing stacked die chiplet 602 is described below in the particular context of GPU terminology for ease of illustration and description, in various embodiments, the architecture described is applicable to any of a variety of types of parallel processors (such as previously described more broadly with reference to FIGS. 2 and 3) without departing from the scope of this disclosure. Additionally, in various embodiments, and as used herein, the term "chiplet" refers to any device including, but is not limited to, the following characteristics: 1) a chiplet includes an active silicon die containing at least a portion of the computational logic used to solve a full problem (i.e., the computational workload is distributed across multiples of these active silicon dies); 2) chiplets are packaged together as a monolithic unit on the same substrate; and 3) the programming model preserves the concept that the combination of these separate computational dies (i.e., the graphics processing stacked die chiplet 402) as a single monolithic unit (i.e., each chiplet is not exposed as a separate device to an application that uses the chiplets for processing computational workloads).

The base active interposer die (AID) 604 (similar to the first base IC die 204 of FIG. 2) of the graphics processing stacked die chiplet 602 includes a first inter-die interconnect structure 608a along a first edge of the base active interposer die 604 (commonly referred to as a "beachfront"). Additionally, the graphics processing stacked die chiplet 602 includes a second inter-die interconnect structure 608b along a second edge of the base active interposer die 604. Although the first inter-die interconnect structure 608a along the first edge is illustrated in FIG. 6 as being positioned parallel relative to the second inter-die interconnect structure 608b along the second edge of the base active interposer die 604, those skilled in the art will recognize that in various embodiments, the first inter-die interconnect structure 608a may also be positioned along edges of the base active interposer die 604 that are relatively perpendicularly positioned in space (e.g., along a left edge and a top/bottom edge of die 604). Additionally, in some embodiments, the base active interposer die 604 includes three or more interconnect structures along other beachfront edges of the base active interposer die 604.

The graphics processing stacked die chiplet 602 includes a plurality of shader engine dies (SEDs) 612 (similar to the virtual compute dies 212 of FIG. 2, but in various embodiments includes any appropriate parallel processing unit) formed over the active interposer die 604. Although illustrated as including three SEDs 612, those skilled in the art will recognize that any number of processing units may be positioned in the processing unit layer stacked above the active interposer die 604. In this configuration, a portion of a conventional graphics complex die (GCD) is pushed up to a second floor based on 3D die stacking methodologies by positioning the plurality of shader engine dies 612 in a layer on top of the active interposer die 604.

In various embodiments, each shader engine die 612 includes a share (often an equal share) of the resources and graphics processing capabilities of a GPU but does not contain the entire graphics pipeline. In particular, a shader engine die 612 includes at least a portion of the graphics processing pipeline microarchitecture. For example, in some embodiments, the shader engine die 612 includes the shader system (not shown), pixel pipes (not shown), geometry logic (not shown), and the like. However, at least a portion of the graphics processing pipeline, such as a command processor 606, is positioned in the underlying base active interposer die 604. Additionally, in various embodiments, the base active interposer die 604 includes one or more levels of cache memory 610 and one or more memory controller PHYs 614 for communicating with external system memory (not shown), such as dynamic random access memory (DRAM) module. The memory controller (not shown) and memory controller PHYs 614 are, in other embodiments, provided on a separate die from the base active interposer die 604.

That is, various cache and inter-connectability components are positioned at the base active interposer die 604 (while high power active processing components are positioned in the stacked SEDs 612). Additionally, at least a portion of graphics pipeline logic, such as logic that controls multiple SEDs 612 together (e.g., the command processor 606) is also positioned at the base active interposer die 604. In this manner, the active interposer die 604 includes caches and a logic that controls multiple SEDs 612 together to control data for geometry state and command processing. This functional grouping of the active interposer die 604 and the plurality of SEDs 612 together form the graphics processing stacked die chiplet 602 (or may be referred to as a "GPU chiplet" for short).

Referring now to FIG. 7, illustrated is a block diagram of a plan view 700 of a graphics processor MCM 702 employing graphics processing stacked die chiplets in accordance with some embodiments. The graphics processor MCM 702 (similar to the parallel processor MCM 202 of FIG. 2) is formed as a single semiconductor chip package including N=3 number of communicably coupled graphics processing stacked die chiplets 602 of FIG. 6. As shown in plan view 700, the graphics processor MCM 702 includes a first graphics processing stacked die chiplet 702a, a second graphics processing stacked die chiplet 702b, and a third graphics processing stacked die chiplet 702c.

As will be appreciated, the increased number of inter-die interconnect structures 608a,608b associated with graphics processing stacked die chiplets 602 allows for a larger number of stacked die chiplets to be communicably coupled together in a single package (e.g., relative to stacked die chiplets 402 which can only be paired, such as illustrated in FIG. 5, due to a single interconnect structure 408 on each stacked die chiplet 402). For example, in various embodiments, the graphics processor MCM 702 includes a first bridge chip 704a that communicably couples the first graphics processing stacked die chiplet 702a to the second graphics processing stacked die chiplet 702b. In particular, the first bridge chip 704a communicably couples the second inter-die interconnect structure 608b of the first graphics processing stacked die chiplet 702a to the first inter-die interconnect structure 608a of the second graphics processing stacked die chiplet 702b. Additionally, the graphics processor MCM 702 includes a second bridge chip 704b that communicably couples the second graphics processing stacked die chiplet 702b to the third graphics processing stacked die chiplet 702c. In particular, the second bridge chip 704b communicably couples the second inter-die interconnect structure 608b of the second graphics processing stacked die chiplet 702b to the first inter-die interconnect structure 608a of the third graphics processing stacked die chiplet 702c.

In various embodiments, the bridge chips 704 are passive or active, in which each bridge chip 704 includes just data/electrical connections or a given bridge chip 704 includes its own logic. For example, in some embodiments, each bridge chip 704 is an active bridge chip having active silicon to operate as a high-bandwidth die-to-die interconnect between the graphics processing stacked die chiplets 602. In other embodiments, the bridge chip 704 is a passive chip.

In some embodiments, an active bridge chip 704 includes one or more cache buffers and therefore extends beachfront edge connectivity, while still providing inter-base-die communications and to route cross die synchronization signals. Caches are naturally an active component (i.e., require electrical power for operations), so the bridge chip 704 is active for holding those cache buffers. Cache sizing is configurable, for example, as a function of the physical size of the active bridge chip 704, for different applications along with different stacked die chiplet configurations, and the stacked die chiplet(s) to which the active bridge chip 704 is communicably coupled do not pay the cost (e.g., costs related to physical space, power constraints, and the like) of this external cache on the bridge chip 704.

In various embodiments, the bridge chip 704 includes a local silicon interconnect (LSI) that provides a small silicon bond in free translation that communicably couples two logic chips together and provides inter-die connectivity between adjacent edges of the two dies with a limited physical scope (e.g., as opposed to mounting the stacked die chiplets 602 to a common interposer substrate and relying entirely on electrical connections provided by the interposer for inter-die communications, such as provided by conventional 2.5D topologies in which the interposer often spans the extent of an entire assembly). In this manner, the intermediary bridge chip 704 communicably couples multiple stacked die chiplets (e.g., the first graphics processing stacked die chiplet 602a and the second graphics processing stacked die chiplet 602b) together. Additionally, in various embodiments, the bridge chip 704 carries a data fabric (not shown) between the two stacked die chiplets to provide a common view of memory.

The coupling of multiple graphics processing stacked die chiplets (e.g., first graphics processing stacked die chiplet 602a to the second graphics processing stacked die chiplet 602b, which is in turn coupled to the third graphics processing stacked die chiplet 602c) together in a single package results in a device that effectively operates as a single large graphics complex die (GCD) but is constructed out of smaller, modular die components. In various embodiments, the graphics processor MCM 702 is communicably coupled to one or more external system memory modules 706 via the memory controller PHYs 614 of the graphics processing stacked die chiplets. Additionally, in some embodiments, the graphics processor MCM 702 also includes input/output (I/O) logic in a multimedia and I/O die (MID) 708 separate from the graphics processing stacked die chiplets 602.

It should be recognized that although various embodiments of base IC die/graphics processing stacked die chiplet have been described here in the context of linear coupling in a row-wise manner, those skilled in the art will recognize that different interconnect structure positioning and/or increased numbers of interconnect structures per base die allow for various other stacked die chiplet configurations. For example, in some embodiments, and with reference to FIG. 6, the first inter-die interconnect structure 608a may also be positioned along edges of the base active interposer die 604 that are relatively perpendicularly positioned in space (e.g., along a left edge and a top/bottom edge of die 604). Additionally, in some embodiments, the base active interposer die 604 includes three or more interconnect structures along other beachfront edges of the base active interposer die 604. Such interconnect structure arrangements enable, for example, various mesh-like tiling configurations with N×M stacked die chiplets per parallel processor MCM.

Accordingly, as described herein, the allocation of GPU processing pipeline components amongst multiple discrete dies to create smaller footprint building blocks (e.g., the various parallel processing stacked die chiplets described herein) that may be subsequently communicably stitched together with an active bridge chip enables manufacture of graphics pipes/chips scalable in a chiplet manner while still able to form a device having similar performance relative to a larger monolithic processor. This modular 3D graphics concept is scalable, separately updatable, and mitigates the cost of assembly by using small die with high yield aspects, and provides value in not only allowing for increased die yield of production per semiconductor wafer but also increases the amount of good dies per semiconductor wafer.

A computer readable storage medium includes any non-transitory storage medium, or combination of non-transitory storage media, accessible by a computer system during use to provide instructions and/or data to the computer system. Such storage media include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium is embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software include the instructions and certain data that, when executed by the one or more processors, manipulate the one or more processors to perform one or more aspects of the techniques described above. The non-transitory computer readable storage medium include, for example, a magnetic or optical disk storage device, solid state storage devices such as Flash memory, a cache, random access memory (RAM) or other non-volatile memory device or devices, and the like. The executable instructions stored on the non-transitory computer readable storage medium include source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A parallel processor, comprising:
a first base integrated circuit (IC) die including a first plurality of virtual compute dies 3D stacked on top of the first base IC die, wherein a first subset of a parallel processing pipeline logic is positioned at the first plurality of virtual compute dies, and further wherein a second subset of the parallel processing pipeline logic is positioned at the first base IC die;
a second base IC die including a second plurality of virtual compute dies 3D stacked on top of the second base IC die; and
an active bridge chip communicably coupling an interconnect structure of the first base IC die to an interconnect structure of the second base IC die so that the first base IC and the second base IC are together addressable as a single monolithic unit.

2. The parallel processor of claim 1, further comprising:
a second active bridge chip communicably coupling the interconnect structure of the second base IC die to an interconnect structure of a third base IC die so that the first base IC, second base IC, and third base IC are together addressable as the single monolithic unit, wherein the third base IC die includes a third plurality of virtual compute dies 3D stacked on top of the second base IC die.

3. The parallel processor of claim 1, wherein each of the first plurality of virtual compute dies and the second plurality of virtual compute dies comprises a shader engine die containing a portion of graphics pipeline logic.

4. The parallel processor of claim 3, wherein the second subset of the parallel processing pipeline logic at the first base IC die includes a command processor configured to control operations of the first plurality of virtual compute dies.

5. The parallel processor of claim 1, wherein the first IC die includes a memory controller configured to communicate with a system memory module external to the parallel processor.

6. The parallel processor of claim 1, wherein the second base IC die includes the first subset of the parallel processing pipeline logic positioned at the second plurality of virtual compute dies, and further wherein the second subset of the parallel processing pipeline logic is positioned at the second base IC die.

7. A system, comprising:

a host processor configured to generate a command stream for execution by one or more parallel processors; and a parallel processor multi-chip module communicably coupled to the host processor, wherein the parallel processor multi-chip module includes:

a first base integrated circuit (IC) die including a first plurality of virtual compute dies 3D stacked on top of the first base IC die, wherein a first subset of a parallel processing pipeline logic is positioned at the first plurality of virtual compute dies, and further wherein a second subset of the parallel processing pipeline logic is positioned at the first base IC die;

a second base IC die including a second plurality of virtual compute dies 3D stacked on top of the second base IC die; and an active bridge chip communicably coupling an interconnect structure of the first base IC die to an interconnect structure of the second base IC die so that the first base IC die and the second base IC die are together addressable as a single monolithic unit.

8. The system of claim 7, further comprising:

a second active bridge chip communicably coupling the interconnect structure of the second base IC die to an interconnect structure of a third base IC die, wherein the third base IC die includes a third plurality of virtual compute dies 3D stacked on top of the second base IC die.

9. The system of claim 7, wherein each of the first plurality of virtual compute dies and the second plurality of virtual compute dies comprises a shader engine die containing a portion of graphics pipeline logic.

10. The system of claim 9, wherein the second subset of the parallel processing pipeline logic at the first base IC die includes a command processor configured to control operations of the first plurality of virtual compute dies.

11. The system of claim 7, wherein the first base IC die includes a memory controller configured to communicate with a system memory module external to the parallel processor multi-chip module.

12. The system of claim 7, wherein the second base IC die includes the first subset of the parallel processing pipeline logic positioned at the second plurality of virtual compute dies, and further wherein the second subset of the parallel processing pipeline logic is positioned at the second base IC die.

13. The system of claim 7, wherein each of the first base IC die and the second base IC die is an active interposer die.

14. An integrated circuit (IC) device, comprising:

a base IC die including:

a plurality of virtual compute dies 3D stacked on top of the base IC die, wherein a first subset of a parallel processing pipeline logic is positioned at the plurality of virtual compute dies, and further wherein a second subset of the parallel processing pipeline logic is positioned at the base IC die; and an interconnect structure positioned along an edge of the base IC die, the interconnect structure configured to be communicatively coupled to an interconnect structure of a second base IC die so that the base IC die and the second base IC die are together addressable as a single monolithic unit.

15. The IC device of claim 14, wherein each of the plurality of virtual compute dies comprises a shader engine die containing a portion of graphics pipeline logic.

16. The IC device of claim 15, wherein the second subset of the parallel processing pipeline logic at the base IC die includes a command processor configured to control operations of the plurality of virtual compute dies.

17. The IC device of claim 14, wherein the base IC die is an active interposer die.

18. The IC device of claim 14, wherein the base IC die includes a memory controller configured to communicate with a system memory module external to the parallel processing pipeline logic.

19. The IC device of claim 14, wherein the base IC includes a physical layer interface.

20. The IC device of claim 14, wherein the base IC die includes a second interconnect structure positioned along a second edge of the base IC die that is parallel in orientation to the edge of the base IC die.

* * * * *